May 27, 1969

R. ADLER ET AL 3,446,975

ACOUSTO-ELECTRIC FILTER UTILIZING SURFACE WAVE PROPAGATION IN WHICH THE CENTER FREQUENCY IS DETERMINED BY A CONDUCTIVITY PATTERN RESULTING FROM AN OPTICAL IMAGE

Filed Nov. 7, 1966

Inventors
Robert Adler
Adrian J. De Vries
By Hugh H. Drake
Attorney

United States Patent Office 3,446,975
Patented May 27, 1969

3,446,975

ACOUSTO-ELECTRIC FILTER UTILIZING SURFACE WAVE PROPAGATION IN WHICH THE CENTER FREQUENCY IS DETERMINED BY A CONDUCTIVITY PATTERN RESULTING FROM AN OPTICAL IMAGE

Robert Adler, Northfield, and Adrian J. De Vries, Elmhurst, Ill., assignors to Zenith Radio Corporation, Chicago, Ill., a corporation of Delaware Filed Nov. 7, 1966, Ser. No. 592,565
Int. Cl. H01j 39/12
U.S. Cl. 250—211 4 Claims

ABSTRACT OF THE DISCLOSURE

A tunable solid state acoustic filter comprises a substrate of a piezoelectric material which is also photoconductive or which has a photoconductive film on a major surface. A pair of fixed conductive electrodes on the major surface extend longitudinally with respect to the direction of surface wave propagation. An optical system is provided for selectively illuminating longitudinally spaced transverse strip portions of the major surface to establish a conductive transducer electrode pattern whose frequency response is dependent upon the spacings between the illuminated transverse strip portions. An adjustable element, such as a zoom lens or a series of interchangeable transparencies, is provided in the optical system for altering the spacings between the illuminated transverse strip portions to change the frequency response of the filter.

This invention pertains to solid state circuitry. More specifically, it relates to an acousto-electric filter in which particular types of surface wave transducers coupled to a piezoelectric material are utilized in a manner enabling signal selectivity, and in which the transducers are so constructed as to permit the center frequency of the device to be externally varied. Although the transducers described may be used in conjunction with an acoustic amplifier of the surface wave variety, the selective characteristics of the basic device make it extremely useful in filter applications and the apparatus is, therefore, initially described in that environment.

Previous methods used to generate and detect surface elastic waves piezoelectrically involved the mechanical coupling of a compressional or shear wave transducer to the body on which the surface waves propagated. It is now known that an electrode array composed of interleaved combs of conductive "teeth" at alternating electric potentials, when coupled to one end of a piezoelectric medium, produces acoustic surface waves on the medium. In the simplified case of a ceramic, poled perpendicularly to the propagating surface, the waves travel at right angles to the teeth; in other cases, the waves may travel at an acute angle to the teeth, the particular angle in a given case being a function of the crystallography of the material relative to the configuration of the array. The surface waves are converted back to an electrical signal by a similar array of conductive teeth coupled to the piezoelectric medium near its output end. In principle, the tooth pattern is analogous to an antenna array. Consequently similar selectivity is possible, thereby eliminating the need for the critical or much larger and more cumbersome components normally associated with selective circuitry.

In many applications where tuning is required, for example in RF strips for television, it is desirable that the selective elements be themselves adjustable, that is, the center frequency of the filter should be variable.

Accordingly, it is a primary object of the present invention to provide an acoustic filter in which the center frequency is variable.

It is a more specific object of the present invention to accomplish the tuning of an acoustic filter by optical means.

A solid state tunable acoustic filter constructed in accordance with the present invention comprises a piezoelectric substrate suitable for the propagation of waves along one of its major surfaces with a portion of that surface coated with or including a photoconductive material. An optical system projects a pattern of energy upon the photoconductive portion with the configuration of the pattern defining transducer conductive elements. The optical system includes a transparency or mask which serves to establish the pattern. A set of such transparencies enables tuning to a number of discrete channels, or the size of a single projected image may be varied by optical or mechanical means to obtain continuous tuning.

The features of the present invention which are believed to be novel are set forth with particularity in the appended claims. The organization and manner of operation of the invention, together with further objects and advantages thereof, may best be understood by reference to the following description taken in conjunction with the accompanying drawing, in the several figures of which like reference numerals identify like elements and in which:

Figure 1:
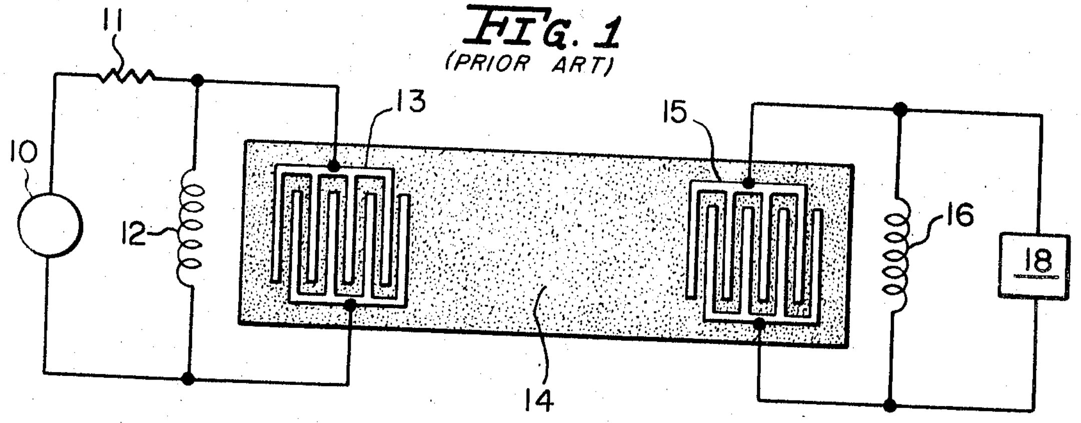
FIG. 1 (PRIOR ART)
FIGURE 1 is a partly schematic plan view of an acoustic filter.

For the purpose of facilitating an understanding of the present invention, FIGURE 1 depicts an acoustic filter which is more completely described and is claimed in the copending application of Adrian De Vries, Ser. No. 582,387, filed Sept. 27, 1966 and assigned to the same assignee. A signal source 10, in series with a resistor 11 representing its internal resistance, is coupled in parallel with an inductor 12 in turn coupled across an input transducer 13. Transducer 13 is mechanically coupled to the surface of a piezoelectric substrate 14 at one, or the input, end thereof. The other, or output end, of substrate 14 is similarly mechanically coupled to a transducer 15 which is coupled across a load 18 paralleled by an inductor 16. Inductors 12 and 16 resonate at the signal frequency with the clamped capacitance $C_0$, the capacity associated with the respective transducers when they are clamped for surface waves. The clamped capacitance $C_0$ is that value of capacitance the structure exhibits while a field is developed between the electrodes but in the absence of piezoelectric action. It usually is measured by applying a signal of a frequency much higher than the resonant frequency of the system so that the mass of the piezoelectric medium heavily damps any tendency of the surface to move in response to the developed fields.

Transducers 13 and 15 are each constructed of two comb type electrodes. The teeth of one comb element are interleaved with the teeth of the other comb element. The electrodes or teeth are of a conductive material such as gold and are vacuum deposited on the plane surface of substrate 14 which is a highly lapped and polished piezoelectric material such as lead zirconate titanate (PZT) or quartz. The distance between the centers of two consecutive teeth is one-half the surface wavelength in the substrate of the signal wave for which it is desired to achieve maximum response.

In operation, direct piezoelectric surface wave transduction is accomplished by the spatially periodic electrodes of transducer 13. Periodic electric fields are produced along the comb array when as signal from source 10 is fed to the electrodes. These fields cause perturbations or deformations of the surface by piezoelectric action. Such piezoelectric action occurs when the strain components produced by the electric fields in the piezoelectric substrate substantially match the strain components associated with the surface wave mode. The mechanical perturbations travel along the surface as waves representative of the input signal. Source 10, for example the antenna of a television receiver, produces a range of signal frequencies, but due to the selective nature of the arrangement only a signal of a particular frequency and its intelligence-carrying sidebands are converted to surface waves. The potential developed between any given pair of teeth produces two waves traveling along the surface of substrate 13 in opposing directions away from the teeth. The resulting surface waves translated along substrate 14 to the right in FIGURE 1 couple to output transducer 15 and there are converted to an electrical output signal for application to load 18. Coupling to reflected waves may be minimized by affixing an acoustic absorber on the opposed end surfaces of substrate 14 or by serrating those ends to disperse any reflected wave energy.

In a typical embodiment, utilizing quartz as the piezoelectric material of substrate 14, the teeth of both transducer 13 and transducer 15 are approximately 0.7 mil wide and are separated by 0.7 mil for selecting a 40 mHz. signal from source 10. The spacing between transducer 13 and transducer 15 is approximately 0.3 inch and the width of the wavefront is approximately 0.4 inch. The structure acts as a double tuned circuit with a resonant frequency of 40 megahertz, the resonant frequency being determined by the spacing of the teeth.

As described with more particularity in the DeVries application previously mentioned, various modifications in the arrangement of the array enable increased selectivity and allow the apparatus to be used with substantial efficiency. For example, selectivity is increased by incorporating additional pairs of electrodes or teeth in the combs. Nevertheless, each electrode pattern is useful at only the one particular narrow frequency band determined by the teeth spacing. On the other hand, in television receivers and various other apparatus it is desirable that the frequency around which the filter is to be selective be controllably variable.

Figure 2:
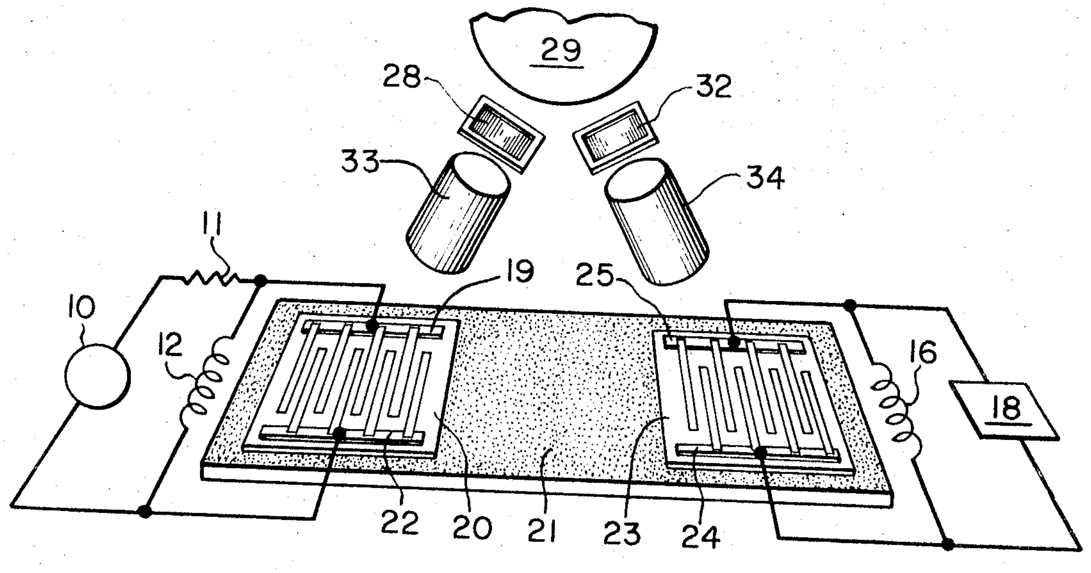
FIGURE 2 is a partly schematic longitudinal side view of one embodiment of an improved acoustic filter.

A device permitting such controlled variation or tuning is depicted in FIGURE 2. One side of source 10, again shown as connected in series with resistor 11 representing its internal resistance and paralleled by inductor 12, is connected to a stripe 19 of conductive material imprinted on the surface of a thin photoconductive film or layer 20 which is itself imprinted near one end on a substrate or bar 21 of piezoelectric material. Stripe 19 is positioned parallel to a longitudinal edge of bar 21. The other side of source 10 is connected to a conductive stripe 22 similarly imprinted on photoconductive layer 20. At the other or output end of substrate 21, a thin film 23 of photoconductive material is affixed. Imprinted upon film 23 are conductive stripes 24 and 25 which are disposed respectively along opposite longitudinal edges of substrate 21. Load 18, paralleled by inductor 16, is connected on one side to conductive stripe 24 and on the other side to conductive stripe 25. The foregoing assumes that the Q of the external input and output resonant circuits formed by each of the inductors 12 and 16 with the clamped capacitance $C_0$, is sufficiently low that the overall response is not unfavorably narrowed by this resonance. Additional series-tuned resonant circuits may, if desired, be inserted in series with resistance 11 and with load 18 in order to broaden the response of the electrical network components.

A zoom lens system 33 focuses an image, produced when radiation from a source 29 is projected through a transparency or mask 28, onto photoconductive film 20. The radiation may be either visible or invisible light. Similarly, a zoom lens system 34 focuses an image, produced when light from source 29 is projected through a transparency 32, onto photoconductive film 23. The lenses in each of the respective systems are so chosen that the images from transparencies 28 and 32 are always in focus upon films 20 and 23, respectively, even though the size of the image is changed by varying the distance between the lenses that make up the zoom system. This, of course, is one of the basic features of the conventional zoom lens arrangement as described and explained in the article by G. H. Cook, "Photographic Objectives," Applied Optics & Optical Engineering, vol. III, R. Kingslake, ed. (Academic Press, New York, 1965) pp. 132–139.

Transparencies 28 and 32 define patterns of interleaved comb-like teeth which, when projected upon films 20 and 23, appear as lighted areas arranged similarly to the teeth patterns of transducers 13 and 15 in the apparatus of FIGURE 1. The projection is directed so that the outer end portions of the teeth of each of the combs fall respectively upon conductive stripes 19, 22, 24 and 25. The latter stripes have sufficient width to insure projection of the optical teeth outer end portions upon the conductive stripes even though there are minor tolerance variations or movements in the projection display system. At the same time, the stripes of each pair are spaced sufficiently far apart to insure that the inner teeth ends do not overlap the stripe of the opposite comb.

The electro-acoustic operation of the FIGURE 2 device is identical to that of the FIGURE 1 apparatus. Specifically, the signal from source 10 impressed across the comb pattern produced on film 20 causes surface waves to propagate along substrate 21 until they reach the comb upon film 24. At that point, the signal is converted to an electrical signal for application to load 18. The difference between the FIGURE 2 device and the device of FIGURE 1 is in the way that the combs are established on the surface of substrate 21. Input photoconductive film 20 is substantially conductive in all regions where it is illuminated and is essentially nonconductive in the unlit regions. Hence, the illuminated teeth areas constitute conductive electrodes of the same pattern as in FIGURE 1. In the darkened areas between the teeth electric fields are induced by the signal from source 10, and the action is the same as that between the teeth in the apparatus of FIGURE 1 with the acoustic surface wave being launched along substrate 21. At the output end of the bar, the optically developed combs act as transducer elements in a manner fully analogous to transducer 15 of the apparatus depicted in FIGURE 1.

In connection with the optical system, there are certain desired requirements for the photoconductive surface. In order to maintain a high degree of efficiency, the ratio of conductivity between area of teeth and the area between the teeth must be quite high. Many conventional photoconductive films have too low a conductivity ratio for high efficiency performance. The more desired ratio may be achieved, however, by making the transducer region anisotropic so that current is more easily conducted along the teeth than between successive teeth. A device incorporating such an anisotropic transducing region is embodied in the copending application of Ruth Siewatz, Ser. No. 592,564, filed Nov. 7, 1966, and assigned to the same assignee as the present invention. The Siewatz embodiment utilizes a combination of normally-conductive and photoconductive ribbons on the surface of the signal translating medium and parallel to the electrode teeth to provide the desired conductivity ratio and thereby leaves the choice of that medium independent of the requirement of anisotropy.

The zoom lens system maintains focus of the projected image while permitting that image to be changed in size. That is, the size of the image, and therefore the spacing between the teeth of the combs, is adjustable controllably. As explained in the aforesaid De Vries application, variation in the spacing of the teeth alters the selectivity characteristic of the apparatus. More specifically, since the distance between the centers of two adjacent teeth is equal to one-half of the surface wavelength of the signal which receives essentially maximum translation, adjustment of the size of the pattern alters the center frequency of the filter passband.

A number of alternatives and modifications also are contemplated. Although the device as described uses interleaved combs with parallel teeth, the optical projection system is equally well suited for use with transparencies on which transducer configuratons of varied other forms, such as those depicted in the aforementioned De Vries application, are defined.

Photoconductive films 20 and 23 have dimensions chosen to accommodate the particular transducer patterns to be projected upon them. Therefore, any part or all of bar 21 may be coated with the photoconductive film, providing the proper areas are kept dark and thus nonconductive. Furthermore, the properties of the photoconductive material itself may be utilized as a part of the signal translating system. For example, when piezoelectric bar 21 is of a material such as cadmium sulphide, which has piezoelectric, semiconductive and photoconductive properties, illumination of selected areas directly upon the bar itself creates regions that constitute electrodes. In any case, conductive stripes 19, 22 and 24, 25 may be omitted as such and their function replaced by projecting a strip of light to produce a conductive path in the photoconductive film across the outer end portions of the teeth, which also are projected, as well as across conductive terminals coupled to the source or load.

When a significant change in the size of the projected image is desired so as to be able to tune the filter over a substantial frequency range, it is necessary that conductive stripes 19, 22 and 24, 25, if present as physical elements, be of sufficient length and spacing, or that the photoconductive area be sufficiently large where the stripes also are projected, to accommodate such change of size without overlap where undesired and to insure overlap of conducting areas where desired. Since tuning of the frequency characteristic requires only a change in the spacing between the comb teeth, in accordance with one modification a cylinder lens element is included in lens systems 33, 34 so that the change in size of the projected image occurs only in the direction across the teeth, that is, in the general direction of surface wave propagation. In this case, conductive stripes 19, 22 and 24, 25 of FIGURE 2 must be of sufficient length to accommodate the projected image at maximum size but there is no need to have a similar concern with respect to the width of the device.

As a further alternative, lens systems 33 and 34 are simply ordinary and conventional projection lens systems. In this instance, tuning the filter characteristic is accomplished in discrete steps by changing from one transparency to another in order to change the spacing between the teeth. This alternative has particular application to a system wherein a number of discrete signal channels are to be selectively received as in the case of reception of television signals broadcast on different assigned channels. Moreover, a plurality of discrete transparencies may be used in such a system to switch between channels with a zoom lens then being used as described for the purpose of fine tuning within the channel. Still further, in many practical applications where fine tuning is required, the zoom lens may be replaced with an ordinary lens. In one suitable arrangement, the distance from the transparency to the lens is approximately equal to the distance from the image to the lens. Such a lens system permits substantial size adjustment with but only insignificant change in focus.

It is known that various anisotropic materials exhibit different surface wave velocities in different directions along their surfaces. These velocity differences in some materials, such as quartz, have been found to be of the order of ten to twenty percent. It is, therefore, also contemplated to rotate the projected image relative to the surface of substrate 21 in order to modify the frequency of maximum response of the resultant filter. That is, changing the surface wave velocity as seen by the transducer electrodes correspondingly changes the wavelength of the acoustic surface waves in the substrate which are coupled so that the effect on tuning is the same as if the teeth spacing were changed.

In all of the arrangements discussed, the effect of the clamped capacitance $C_0$ increases with an increase in frequency. Of course, that capacitance can be reduced by shortening the length of the teeth, but this likewise reduces the overall signal magnitude being translated. A preferred approach to the reduction of the clamped capacitance is to connect two or more of the comb arrays in series for each transducer. For this purpose, discrete images of the two or more different patterns are projected and conductive stripes, formed either permanently or by means of photoconductive illumination, are interconnected and connected to the external source in series circuit relationship. In general, then, the use of a plurality of discrete transparency patterns enables not only a change of the center frequency of the filter but also permits the entire configuration of the projected pattern to be changed in any manner desired.

While emphasis has been placed herein upon the attainent of a highly selective but yet tunable filter, it is to be noted that such optically projected transducers may also be utilized in conjunction with an amplifier by incorporating the principles disclosed in Adler application Ser. No. 499,936, filed Oct. 21, 1965 which was replaced by a continuation-in-part application Ser. No. 669,533 filed Sept. 21, 1967, issued June 11, 1968 as Patent No. 3,388,334, and assigned to the same assignee. Briefly, such amplification is obtained by means of interaction between the surafce waves induced in the piezoelectric material and charge carriers drifting in an adjacent semiconductive film or in the material itself if also semiconductive.

The disclosed apparatus affords new and improved selective circuitry which has substantial advantages over predecessor devices. It allows simple optical tuning of the transducer to a desired frequency. The entire physical structure, including the film and the substrate with the conductive elements, lends itself to use in conjunction with integrated circuits. Utility is found in application to transducing, filtering, translating, frequency-discriminating and amplifying stages.

While particular embodiments of the present invention have been shown and described, it will be obvious to those skilled in the art that changes and modifications may be made without departing from the invention in its broader aspects. Accordingly, the aim in the appending claims is to cover all such changes and modifications as fall within the true spirit and scope of the invention.

We claim:

1. A tunable solid state acoustic signal-translating device comprising:
 a piezoelectric substrate of which at least a major surface portion is photoconductive;
 a pair of fixed conductive electrodes on said major surface, which electrodes extend longitudinally with respect to a predetermined direction of surface wave propagation;
 an optional system including a light source for selectively illuminating a series of longitudinally spaced transverse strip portions of said major surface, with alternate illuminated strip portions contacting one of said conductive electrodes and the remaining illuminated strip portions contacting the other of said conductive electrodes, to constitute a conductive transducer electrode pattern whose frequency response is dependent on the spacings between said illuminated transverse strip portions; and
 means including an adjustable element in said optical system for altering the spacings between said illuminated transverse strip portions to change the frequency response of said signal-translating device.

2. A tunable solid-state acoustic signal-translating device according to claim 1, in which said substrate comprises a body of piezoelectric material having a photoconductive surface film.

3. A tunable solid-state acoustic signal-translating device according to claim 1, in which said adjustable element in said optical system comprises a zoom lens.

4. A tunable solid-state acoustic signal-translating device according to claim 1, which further comprises an additional pair of fixed conductive electrodes on said major surface and means including a light source for selectively illuminating an additional series of longitudinally spaced transverse strip portions of said major surface, with alternate ones of the additional illuminated strip portions contacting one of the additional conductive electrodes and the remaining additional illuminated strip portions contacting the other of the additional conductive electrodes, to constitute a second conductive transducer electrode pattern spaced from the first in said predetermined direction of surface wave propagation.

References Cited

UNITED STATES PATENTS

| | | | |
|---|---|---|---|
| 3,185,942 | 5/1965 | White | 310—8 |
| 3,202,824 | 8/1965 | Yando | 250—211 |
| 3,234,488 | 2/1966 | Fair | 310—8.1 |
| 3,274,406 | 9/1966 | Sommers | 310—8.1 |
| 3,353,891 | 11/1967 | Rosenberger | 350—43 |
| 3,360,327 | 12/1967 | Rosenberger et al. | 350—43 |
| 3,360,749 | 12/1967 | Sittig | 333—30 |

RALPH G. NILSON, *Primary Examiner.*

T. N. GRIGSBY, *Assistant Examiner.*

U.S. Cl. X.R.

250—216; 310—8.1, 8.3; 315—55; 333—72; 350—40, 41 42, 43